United States Patent [19]

Hung et al.

[11] Patent Number: 5,442,391
[45] Date of Patent: Aug. 15, 1995

[54] METHOD AND A SYSTEM FOR TESTING A CATHODE RAY TUBE OR LIKE PRODUCTS

[75] Inventors: Yi-ping Hung; Yau-liang Tsai; George J. Yang, all of Taipei, Taiwan

[73] Assignee: Eerise Corporation, Taipei, Taiwan

[21] Appl. No.: 252,404

[22] Filed: Jun. 1, 1994

[51] Int. Cl.⁶ .................... H04N 17/00; H04N 17/04
[52] U.S. Cl. ................. 348/190; 348/180
[58] Field of Search ............... 348/180, 184, 189, 190; H04N 17/00, 17/04

[56] References Cited

U.S. PATENT DOCUMENTS 5,111,110  5/1992  Houben ........................... 348/180
5,216,504  6/1993  Webb et al. ...................... 348/190

FOREIGN PATENT DOCUMENTS 404700  12/1990  France ............... H04N 17/04
29195    1/1990  Japan ................ H04N 17/04
328412   5/1992  Japan ................ H04N 17/04

*Primary Examiner*—James J. Groody
*Assistant Examiner*—Glenton B. Burgess
*Attorney, Agent, or Firm*—Hedman, Gibson & Costigan

[57] ABSTRACT

A method and a system for testing a cathode ray tube (CRT) or like products such as a cathode ray tube monitor, using at least two electronic cameras which offer a stereo vision to read a locating pattern produced on the screen of a tested CRT, thereby a preparatory positioning process of the CRT relative to the electronic cameras is not necessary.

10 Claims, 9 Drawing Sheets

4-0 "NOMINAL S-Mn" is inputted into computer 4-1 Illuminate the frame
Use a single camera (K1) to read the frame 4-2 Produce a locating pattern on the screen; Use at least two cameras (K1) to (K3) to read the locating figure, obtaining "POSITION K-Mn"

4-3 Produce a standard test pattern on the screen; Use a single camera (K1) to read the standard figure, obtaining "ACTUAL S-Mn"

4-4 Compare "ACTUAL S-Mn" with "NOMINAL S-Mn", obtaining the deviations of the standard figure on the screen 4-5 Manual or automatic adjustment? → Manual → Display the deviations automatic 4-6 automatic adjust the geometrical parameters

FIG. 4

METHOD AND A SYSTEM FOR TESTING A CATHODE RAY TUBE OR LIKE PRODUCTS

BACKGROUND OF THE INVENTION

The present invention relates to a method and a system for testing a cathode ray tube (CRT) or like products such as a cathode ray tube monitor. [Note: here the term "cathode ray tube monitor" means a dismantled monitor, i.e. the housing of the monitor is removed for testing purpose, leaving the assembly of its CRT, control circuit and the bezel of the screen. The present invention is mainly directed to the testing of CRT monitor. However, for the sake of simplicity, both CRT and CRT monitor are hereinafter generally referred to as "CRT".]

The cathode ray tube of a television or a monitor, after finished in its production line, must be tested and adjusted to correct its various geometrical and optical deviations and distorsions. The test and adjustment of geometrical deviations, for example, mainly relied upon physical labor in the past, wherein a standard test pattern, which is generally a chessboard-like lattice, namely "crosshatch", formed by m vertical lines and n horizontal lines (m and n are positive integers, preferably odd numbers and can be equal to each other, for example, a 5×5 latticework formed by 5 vertical and 5 horizontal lines) are produced on the screen of a monitor to be tested. The distances between the individual intersecting points (used as reference points) are measured by physical labor to obtain the deviations of the actual values of the geometrical parameters from the nominal values thereof and to adjust and to correct these parameters. In the recent few years, it was suggested to use an electronic camera instead of the human eyes to read the standard test pattern from the screen and input the data into a computer for processing to obtain the geometrical deviations of a tested CRT. An example is disclosed in a co-pending U.S. patent application Ser. No. 08/059,779, of the applicant. (See FIG. 10). When an electronic camera is used to read the relative position of the reference points of a standard figure on a screen, the margins of the screen (i.e. the border lines of the screen and the frame of a monitor) are practically used as baseline to facilitate the locating of the center of the screen. The bezel is read at first, then the standard test pattern is read, thus locating the center of the screen and thereby obtaining the actual positions (coordinates) of the reference points of the standard test pattern on the screen (hereinafter referred to as "ACTUAL S-Mn"). The nominal positions of the reference points (hereinafter referred to as "NOMINAL S-Mn") were previously stored in the computer. A comparison between the actual positions and the nominal position is performed to obtain the geometrical deviations of the CRT, which can then be displayed for an operator to make manual adjustment or correction, or alternatively (in the case of automatic adjustment) directly be transmitted to an automatic adjusting device to make automatic adjustment or correction. [NOTE: In the above known technique involving electronic cameras, there are some known systems which use not merely a single electronic camera, but a plurality of (for example three or four) electronic cameras, each responsible for only a respective zone of a screen. For example, the first, second, third and fourth cameras respectively read the upper right, lower right, lower left, and upper left quarters (zones) of the screen. The reason for the use of more than one electronic camera is that the resolution of an electronic camera may not be high enough to sufficiently resolve all the tiny pixels of a screen. In principle, however, these cameras works similarly as a single-camera system. The respective reading of divided zones of a screen by a plurality of electronic cameras is similar to the compound eyes of a fly. Thus the known system with a plurality of electronic cameras is hereinafter referred to as "compound eye system", in contrast to a "single eye system" which uses a single electronic camera to read a whole screen.]

In the known technique, when reading a screen using an electronic camera or more electronic cameras, it is necessary to accurately fix the position of the electronic camera relative to the screen. For this reason, in the known single-eye or compound eye systems, mechanical adjusting/positioning means are provided to position and to fix a tested screen relative to the electronic camera in all directions X, Y and Z. Such mechanical means occupies a considerable portion in the volume, weight, and energy consumption of the system. The mechanical positioning procedure also occupies a considerable portion of the time of a test cycle. Moreover, the mechanical positioning means must rigidly touch the frame of the screen during the test, thus causing uncomfortable noises and suffering the risk of the damage of the products. These disadvantages are inevitable in all the currently used systems and not yet overcome.

To solve this problem, the mechanical positioning which involves concrete contact with the frame of the screen must be replaced by a contactless method, using intangible softwares to locate the screen. In so doing, the mass, the volume, the energy and time consumption of the system can be greatly saved.

If the conventional contact-type mechanical positioning is abandoned, the electronic camera can no longer be accurately positioned relative to the screen. Since the visual field of an electronic camera is a two-dimensional planar projection, it cannot accurately evaluate the three dimensional (3D) coordinate of a screen which is not positioned in predetermined relationship to the camera, but randomly situated. In the conventional system, owing to the mechanical positioning means, the camera always reads only one kind of planar projection. Once the positioning means is abandoned, the camera will read different projections from different angles. For the conventional single eye or compound eye system, it is impossible to accurately locate a screen without mechanical positioning means.

According to the present invention, this problem is solved by using at least two, and preferably three electronic cameras to respectively read the whole screen from different angles. (The assembly of these electronic cameras will be hereinafter referred to as "electronic camera assembly".) Just as two eyes can evaluate the distance of an object from the optical angle, two electronic camera can accurately locate a screen from the different planar projections they read. Since the position (3D-coordinate) of the electronic camera assembly can be known (if it is fixed in a definite site), the position (3D-coordinate) of the screen can be known. Then a standard test pattern can be produced on the screen, which is then read to obtain the actual positions of its reference points relative to the screen. [NOTE: In reading the standard figure, a single electronic camera will be enough to obtain the actual positions of its reference points, since the accurate position of the screen has been known.] Since both the position of the screen and the position of the standard test pattern are known, the actual positions of the reference points relative to the screen ("ACTUAL S-Mn") can be known. Then the data can be compared with the nominal positions of reference points ("NOMINAL S-Mn") to obtain the deviations, using conventional methods.

A system to realize the method of this invention comprises an assembly of at least two electronic cameras for this purpose. The output of each electronic camera is connected to a computer. In order that the computer can execute the method of this invention, the system further comprises the corresponding data and softwares required for the execution of the method, which can be installed in the computer in form of modules.

It is known to use two electronic cameras to measure the dimensions of an object (generally known as "stereo vision"). Although the "stereo vision" technique was discussed in some publications, it has never been utilized in testing a screen.

Besides, it is noteworthy that there are a certain differences between the test of a screen and the measurement of ordinary objects. A point P of an ordinary object (for example, a workpiece) always appears optically the same to an electronic camera however the object is rotated, i.e. from whatever angle. The image of the point P is directly read into the camera without any refraction. But this is not the case for a screen. A bright point on the screen is produced by the bombardment of an electronic beam on the fluorescent coating on the backside of the glass panel of a screen. The bright point is read not directly, but through the glass panel, into the electronic camera. Thus the refraction of its image may vary with different reading angles of the electronic camera. The refractive factor as a function of the angle of the electronic camera had better be taken into consideration to obtain the highest accuracy of the read data. As for the details of the correction of such refractive factor, the modern computer software technique can sufficiently deal with it.

Theoretically, two electronic cameras are enough for "stereo vision". But the stereoscopic detection will be still better if an additional third electronic camera is used. It is proved that the rate of poor test is greatly reduced if three instead of two electronic cameras are used.

In the known "stereo vision" technique, the two electronic cameras must be fixed relative to each other, and the internal and external parameters of their lenses must be corrected, before the cameras can be used for measurement. Likewise, in the system according to this invention, the three electronic camera must be fixed on a carrier board prior to their use in testing CRT, and like correction must be performed. Then the carrier board together with the electronic cameras is mounted as a whole onto the system for use.

The system according to this invention, with its two or more electronic cameras which offer a stereoscopic sight, is hereinafter referred to as "stereoscopic (or 3D) plural eye system".

When electronic camera/cameras is/are used to read a screen (in whatever system, the conventional single-eye system, the compound-eye system, or the 3D plural-eye system of this invention), the margin of the screen is often used to facilitate the reading and the locating of the center of the screen. To locate the margin, the frame (or in technical terminology "bezel") of the screen must be read. Unlike the optically active screen, the bezel is not self-glowing. Hence an additional light source must be used to illuminate the optically passive bezel to enable the electronic camera to read it. In the aforesaid co-pending U.S. patent application, an annular fluorescent tube (FL) serves as the light source. Moreover, in the conventional systems, the electronic camera works in a dark box, thus there is no risk of the disturbance of exotic light. In the present invention, such a dark box is absent. In order to isolated the camera from foreign lights, a dark curtain can be used. The additional light source for the present invention must be such that a reflected beam from the glass panel of the screen never reaches the electronic cameras. For this purposes, the light source preferably illuminates the bezel from a very low incident angle.

The principle of this invention has been clearly stated hereinbefore. In the following are the further details of a preferred embodiment of this invention, illustrated in connection with the accompanying drawing in which:

BRIEF DESCRIPTION OF THE DRAWING

FIG. 4 is a flow chart of the software used in the 3D three-eye system of this invention;

DETAILED DESCRIPTION OF PREFERRED EMBODIMENT

Figure 1:
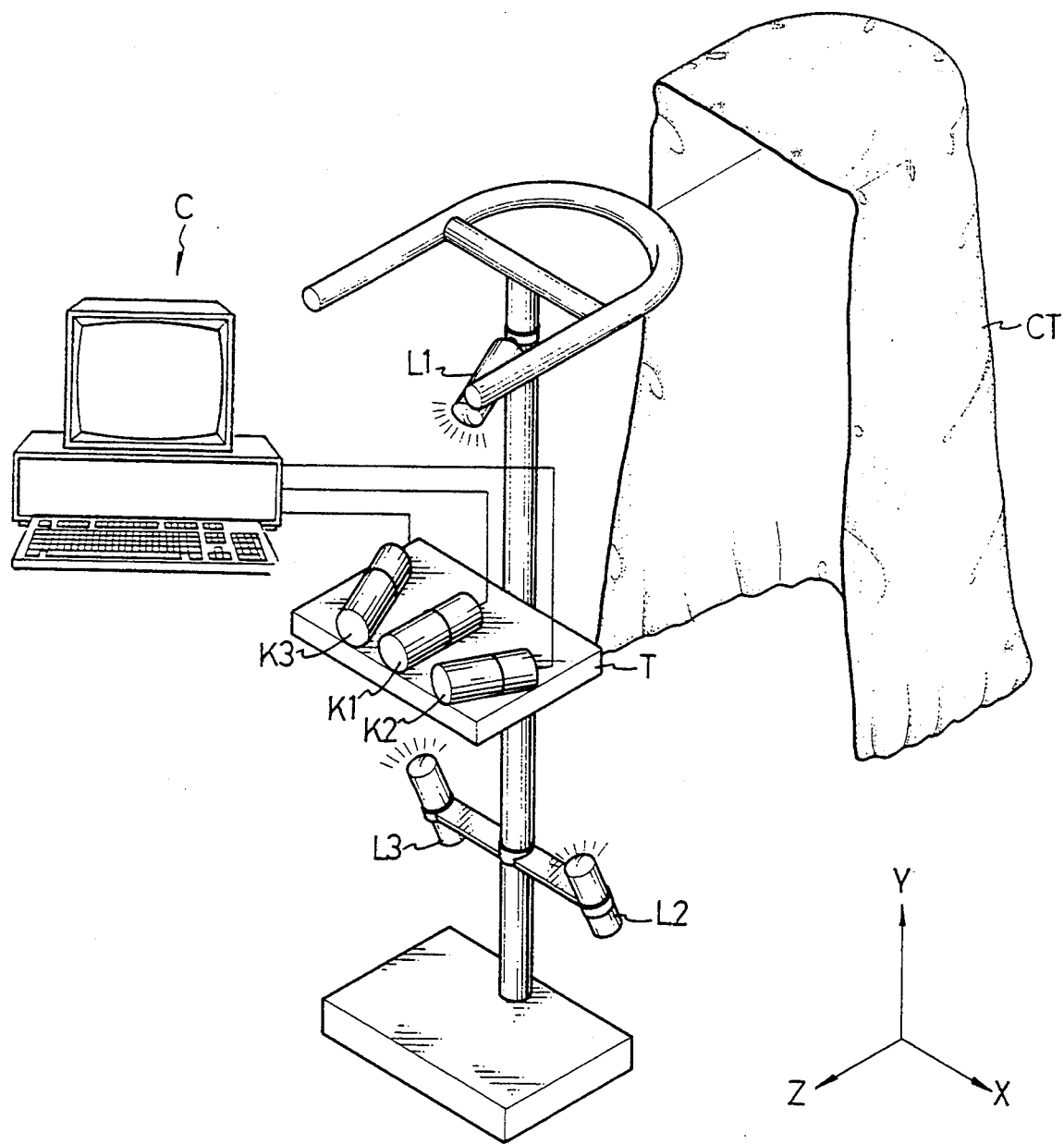
FIG. 1 is a perspective view of a system according to this invention.

Referring to FIG. 1, as stated before, the stereoscopic plural eye system comprising an electronic camera assembly having at least two, and preferably three electronic cameras (K1) (K2) and (K3) fixed immovably on a carrier board (T), and three lights (L1), (L2) and (L3) to illuminate the frame of a tested screen. The lights must be so arranged that their reflected beam from the glass panel of the screen never reach the lens of the cameras (K1) to (K3). To prevent the influence of alien light, a black curtain (CT) is provided, draped at a U-shaped hanger (H) of the system. The read data of the electronic cameras (K1) to (K3) are transmitted to a computer (C) for processing.

Figure 2:
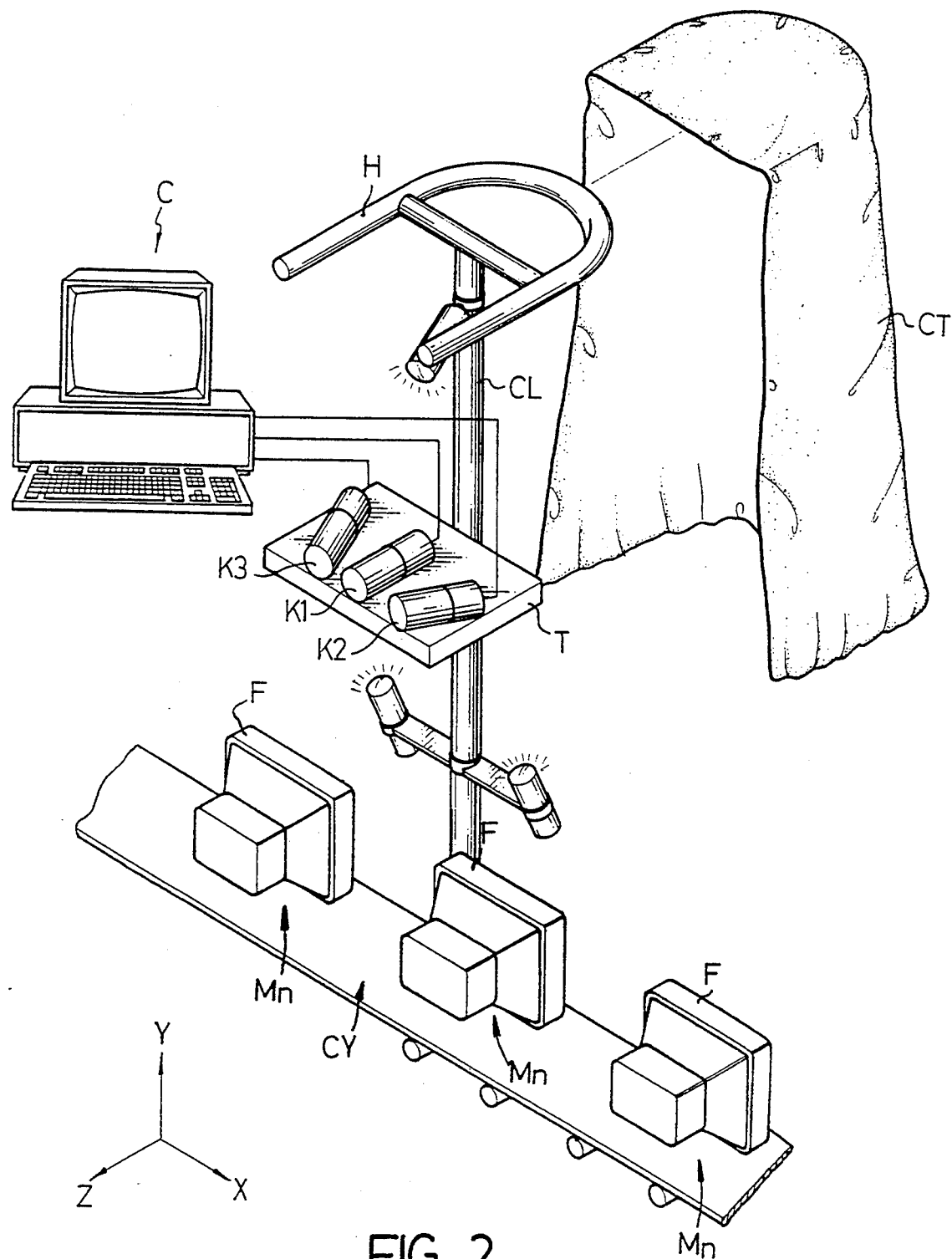
FIG. 2 is a perspective view of the system in FIG. 1 in operation.
Figure 10:
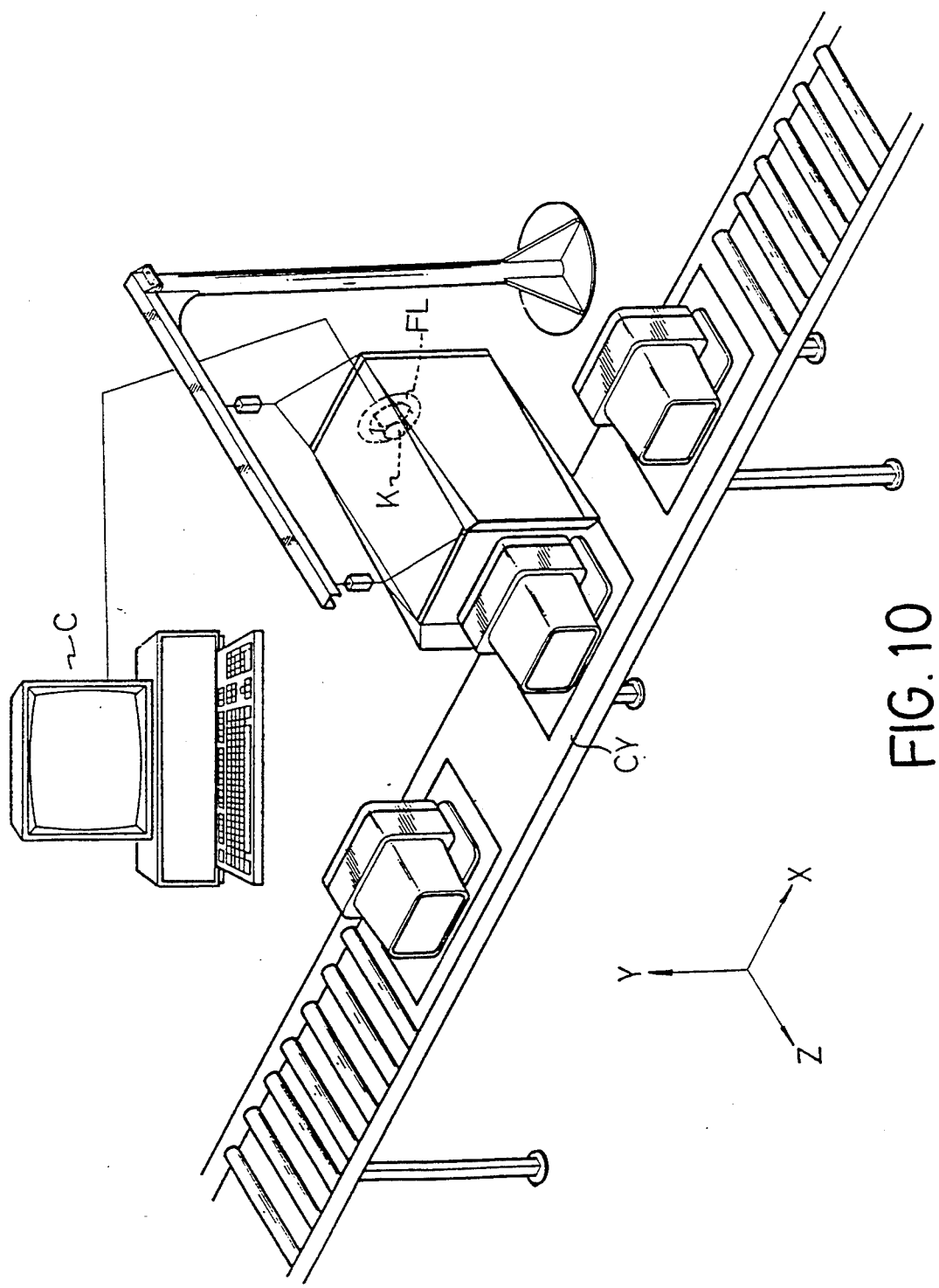
FIG. 10 is a conventional single-eye system.

In comparison with the conventional systems (for example, as the one shown in FIG. 10), the system according to the present invention spares a bulky dark box (DB) and its corresponding supports or suspension. In use, the system stands erectly, occupying only a narrow area. This greatly facilitates an operator to move around. FIG. 2 illustrates the system according to this invention used to test a row of monitors (Mn) intermittently shifted in a horizontal direction X on a conveyor (CY).

Figure 3:
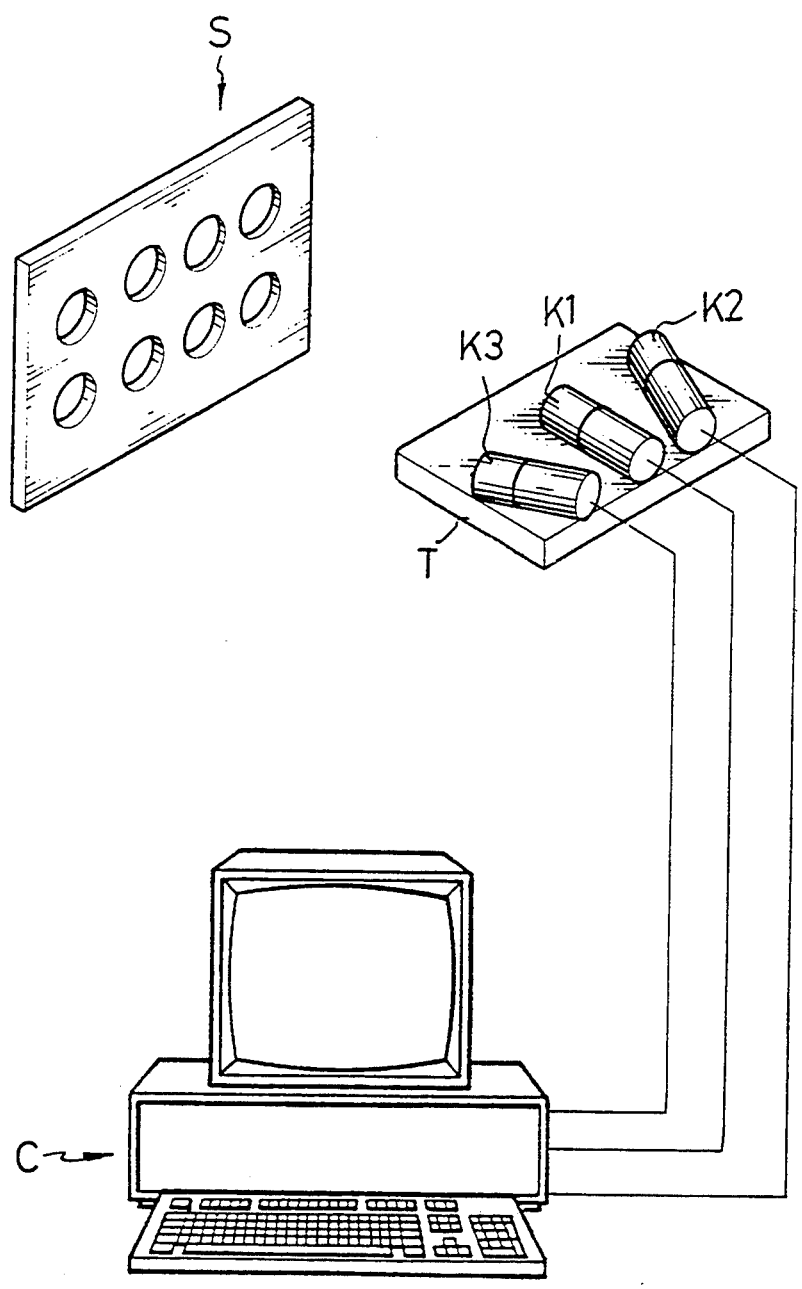
FIG. 3 is a schematic representation showing the interrelating and the correction of the electronic cameras prior to their use in testing CRT.

In the conventional "stereo vision" technique, the position of the two cameras relative to each other must be known before they can be used in measurement. Likewise, in the present invention, the position of all the cameras (K1) to (K3) relative to each other (hereinafter referred to as "POSITION K1-K2-K3") must be known by the computer. To recognize the POSITION K1-K2-K3, an accurately dimensioned "standard plate" (S) (for example a punched steel plate) of which the dimensions are accurately measured, can be used. The three cameras (k1) to (K3) are fixed on a carrier board (T) at first, and then allowed to read the standard plate (S) (See FIG. 3) for interrelating. Since the dimensions of the stand plate are accurately determined known values, the relative position "POSITION K1-K2-K3" of the cameras can be easily calculated from their different read images. The relative position "POSITION K1-K2-K3", together with the internal optical parameters and focus of the cameras are inputted into the computer (C). Then the cameras (K1)-(K3) together with the carrier board (T) as an entity can be mounted on the stand of the system for use. Since the relative position "POSITION K1-K2-K3" is known, if the three cameras (or any two of them) read some reference points of the standard plate, the computer can associate the different images of these reference points read by respective cameras to find their actual positions (coordinates). The software required for the calculation of the relative position "POSITION K1-K2-K3" and the association of the different read images of the cameras (K1) to (K3) (hereinafter referred to as "Software I") is installed in the computer (C) in advance.

In the conventional single-eye or compound-eye systems, the relative position between the electronic camera(s) and the screen is constant because of their mechanical positioning means. One only needs to input the constant relationship into the computer beforehand. Then the electronic camera(s) can directly read the frame of the screen and the standard figure produced on the screen to obtain the actual positions of the reference points. But in the present invention, the relative position between the electronic cameras (K1) to (K3) and a tested screen (hereinafter referred to as "POSITION K-Mn") is not constant, but random. Thus this relative position "POSITION K-Mn" must be obtained in advance and inputted into the computer. This procedure corresponds to the steps 4-1 and 4-2 of the flow chart in FIG. 4.

Figure 7:
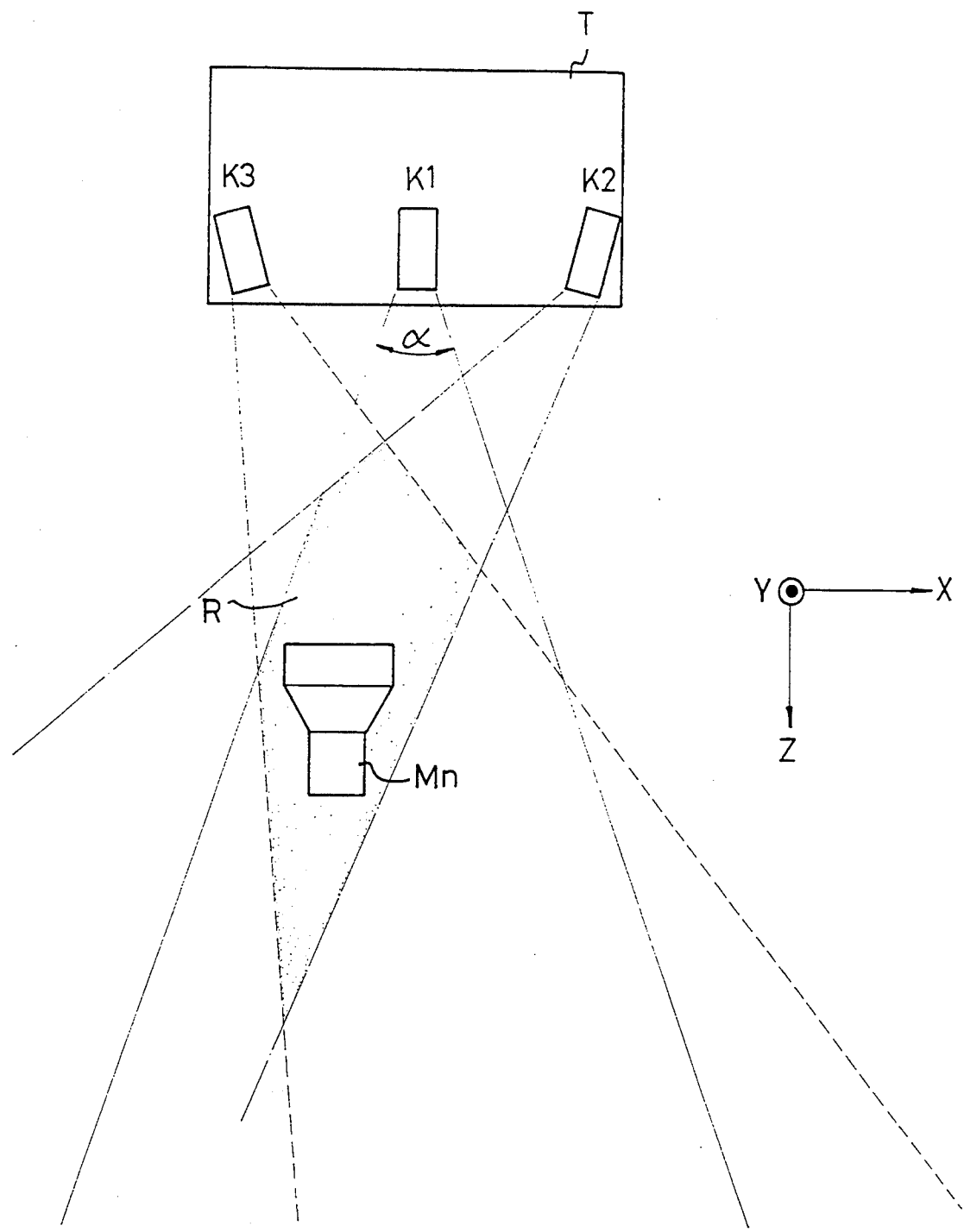
FIG. 7 is a plan view showing the range (as the intersection of the visual fields of the three cameras) which the 3D three-eye system of this invention can cover.
Figure 8:
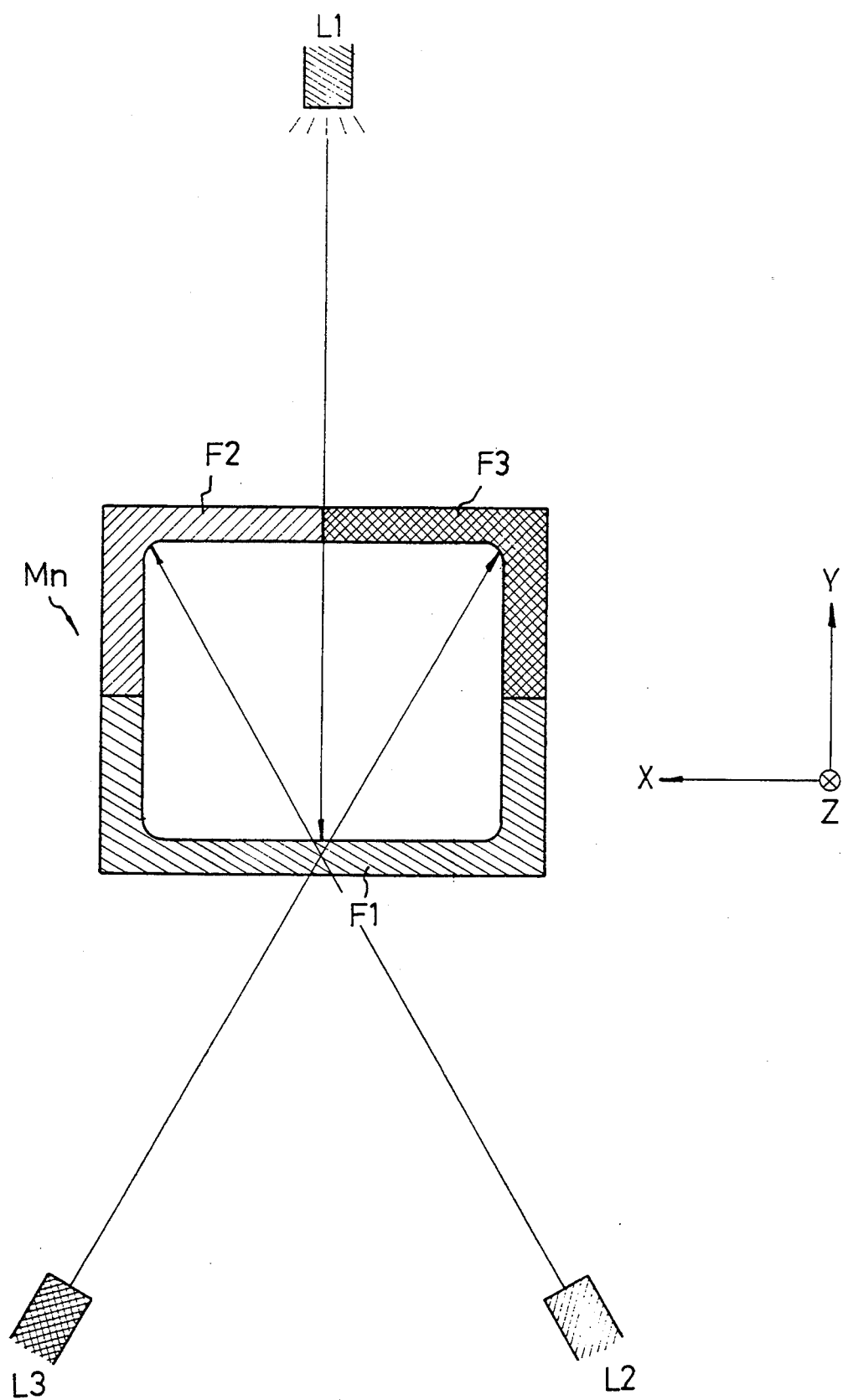
FIG. 8 is a frontal view showing how the individual areas of the bezel of a monitor is illuminated by respective light means.

To read the bezel (F), the lights (L1)-(L3) are turned on (See FIG. 7). Now the illuminated bezel (F) can be read. In this step, only one of the three electronic camera (K1)-(K3), preferably the middle one (K1), is required to read the illuminated bezel. (Step 4-1)

Figure 5:
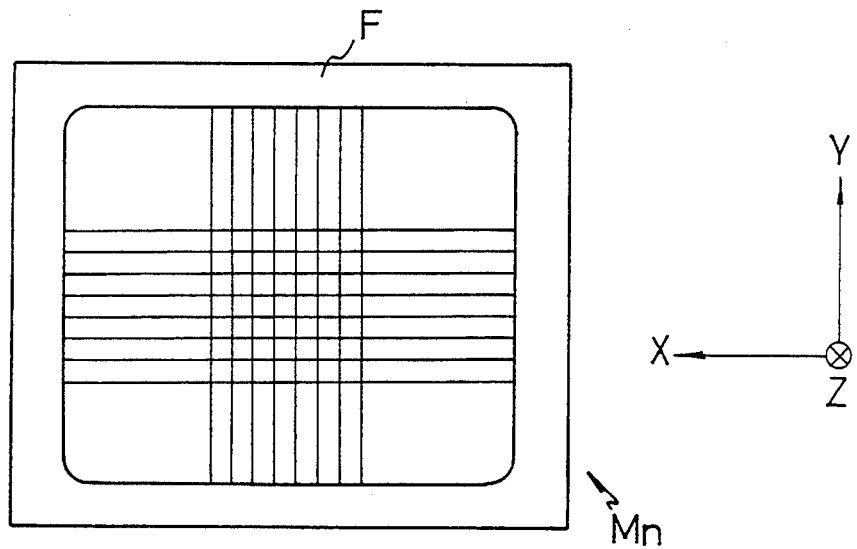
FIG. 5 is a locating pattern produced on a screen to be tested.

To obtain the relative position "POSITION K-Mn", the reading of the bezel (F) alone is not enough. This only guarantees to obtain a rough relationship between the bezel and the cameras. To obtain the accurate spatial coordinate of the screen, at least three locating points (P1), (P2) and (P3) (not shown) must be produced on the screen. Since three points can determine a spherical plane (the screen is a spherical plane), the cameras (theoretically two are enough, but preferably three) can accurately locate the screen by reading the three locating points. In the precedent step 4-1, the position of the frame has been roughly known. This helps avoid misreading of the points. (For example, to mistake P1 for P3) In practice, one does not use merely three locating points for this purpose, but uses a special "locating pattern" produced on the screen. [NOTE: the "locating pattern" has nothing to do with, and is not to be confused with the "standard test pattern"!] FIG. 5 shows an 8×8 locating pattern comprising eight horizontal lines and eight vertical lines. As opposed to the case of a standard test pattern, all the horizontal lines and the vertical lines of a locating pattern must extend to the margin of the screen to ensure that all the intersections (here sixty four points) of the lines of the locating pattern fall in the scope of the screen.

The accurate position of the screen relative to the cameras (K1) to (K3) (POSITION K-Mn) can be obtained by using the "stereo vision" with at least two electronic cameras (K1) to (K3) to read the locating pattern. Since the spatial coordinate of the camera assembly (K1)+(K2)+(K3)+(T) can be known and fixed, the coordinate of the screen can be easily obtained. (Step 4-2)

Figure 6:
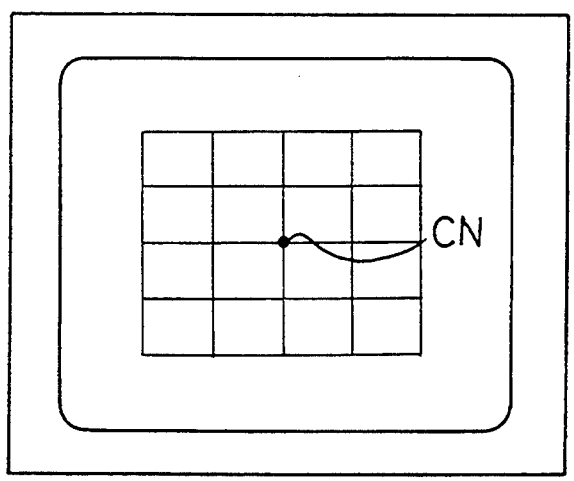
FIG. 6 is a standard test pattern produced on a screen to be tested.

Then a standard test pattern can be produced on the screen for test.(See FIG. 6). Now that the accurate coordinate of the screen is known, a single camera is sufficient to read the standard test pattern to obtain the actual position of the reference points on the screen (ACTUAL S-Mn). However, this single camera must be the very camera which is used in the step 4-1, preferably the middle one (K1), since a screen always appears the least obliquity to the middle camera. (Step 4-3)

[NOTE: When a standard test pattern is produced on the screen, there are various kinds of geometrical deviations. However, all these deviations can be expressed by or deduced from the deviations of the positions of the reference points. Thus in the specification, when talking about the measurement of all kinds of geometrical deviations, we only simply use the term "the deviation of the actual positions of the reference points from their nominal positions" to cover all the possible geometrical deviations.]

In the step 4-1 where the frame (F) is read, there is no refractive influence regardless of the angle from which the responsible camera (K1) reads the frame. But in the steps 4-2 and 4-3 where the locating pattern and the standard test pattern are respectively read, the refractive factor will affect the result more or less, depending on the reading angle of the used camera(s). Thus the refractive influence as a function of reading angle can be taken into account in steps 4-2 and 4-3.

The standard test pattern used in this invention (see FIG. 6), just like what is used in the conventional systems, comprises an m×n (e.g. 5×5) chessboard-like lattice (or in technical terminology "crosshatch"), of which the horizontal and vertical lines do not extend to the margins of the screen. Both m and n are preferably odd number, so as to offer the lattice a concrete center. m and n can be equal.

It is noteworthy that the step 4-1 is not compulsory for the execution of step 4-2, but the former can help the camera read more easily and prevent the misreading thereof. However, the step 4-1 is necessary for step 4-3. Thus, if one passes step 4-1 and directly go to step 4-2, then one still has to do the step 4-1 before entering step 4-3.

As stated before, in both step 4-1 and step 4-3, only a camera will be enough. The camera used in the two steps can be any one of the cameras (K1) to (K3), but the camera used in both steps must be the same one. In step 4-2, at least two electronic cameras must be used to offer a stereoscopic sight. Preferably three electronic cameras are used to ensure a high reliability.

The nominal positions of the reference points on the screen (NOMINAL S-Mn) must be stored in the computer (C) in advance (Step 4-0). This value "NOMINAL S-Mn" is compared with the "ACTUAL S-Mn" obtained in step 4-3 to give the deviations of the reference points (Step 4-4). Then the deviations can be treated in conventional ways.(step 4-5) As in the conventional single eye system, the deviations can be displayed for manual adjustment or transmitted to an automatic adjusting machine for automatic adjustment. The substantial software involved in FIG. 4 (including the procedure from step 4-1 to step 4-5, hereinafter referred to as "Software II") can be installed in the computer (C).

The important points of this invention has been described hereinbefore. In the following are some minor trivial details.

Unlike the conventional system in which the tested monitor must be accurately positioned relative to the camera(s) prior to a test, the system according to the present invention can directly read a monitor entering its traverse, insofar as the whole screen falls in the overlapping region (the shaded area R in FIG. 7) of the visual fields of the three cameras (K1) to (K3). In the conventional systems, the dark box (DB) must be manually or mechanically engaged with a monitor before a test and disengaged from the latter after the test. The engagement and disengagement require a considerable time and often make the bottle neck of a test cycle. Faults may occur during the engagement or disengagement. With the present invention, the complete test requires neither physical labor nor mechanical means, and can be finished in a very transient while, all relying upon the intangible computer softwares, which occupy no space and consume little energy. The risk of fault is eliminated.

The illuminating means must sufficiently illuminate the bezel (F) without that the light reflected from the screen may reach the electronic cameras [at least, the camera in charge (K1)]. For this reason, the beams preferably fall on the bezel at a low incident angle. FIG. 1 shows a practical arrangement of illuminating means, comprising an upper light (L1) and two lower lights (L2), (L3), respectively responsible for the illumination of the lower half (F1), the upper left (F2) and upper right (F3) of the bezel (F). The reason why the upper bezel requires one more light (i.e. a stronger intensity) than the lower bezel is that the possible interference of foreign lights always comes from above and seldom from below. As for how to locate the center of the screen using the margins of the bezel, it is basically similar to the conventional single eye system. Thus further details are not necessary.

As stated before, the intersection (R) of the visual fields of the cameras (K1) to (K3) must cover the whole tested screen. If the system with an electronic camera assembly (K1)+(K2)+(K3)+(T) which is adapted to test 14-inch screens, is desired to test larger screens (for example, 19-inch) which is beyond its test range, the electronic camera assembly can be replaced by another one with a broader testing range. Of course the related data in the computer (C) must be correspondingly modified.

Finally, according to a minor feature of the present invention, an auxiliary measure for use in the automatic adjustment of the standard test pattern is provided.

During the automatic adjustment, the standard test pattern sometimes deviates so far, that an "out-of-phase splitting" of the pattern may occur (i.e. the right or left, or the upper or lower marginal area of the pattern disappears into the right or left margin or upper or lower margin of the screen, and reappears from the opposite side, i.e. from the left or right, or lower or upper margin of the screen, making a splitted figure.) The reappearing, splitted part may even overlap with the original pattern, thus causing many troubles. According to the auxiliary measure, this problem can be easily and reliably solved to enable the reading and measurement of the pattern to be performed easily and rapidly. This auxiliary measure involves an auxiliary bright area (herein after referred to as "auxiliary pattern" Zn) in and concentric with the standard test pattern (for example, an 5×5 chessboard-like lattice or "crosshatch" comprising five vertical lines X1 to X5 and five horizontal lines Y1 to Y5). Any geometrical figure which satisfies the two following requirements can be used as the auxiliary pattern:

1. The geometrical mass center of the auxiliary pattern must coincide with the center (CN) of the standard test pattern;

2. The auxiliary pattern must be included in the interior of a rectangle defined by the two horizontal lines (in FIG. 9, the lines Y2 and Y4) and the two vertical lines (in FIG. 9, the lines X2 and X4) immediately adjacent to the center (CN) of the standard figure.

[NOTE: According to the definition in geometry, the "interior" of a geometrical figure, say a rectangle, does not include its sides. Thus the extension of the auxiliary figure cannot even touch the lines X2, X4, Y2 and Y4, let alone beyond them.]

Figure 9A:
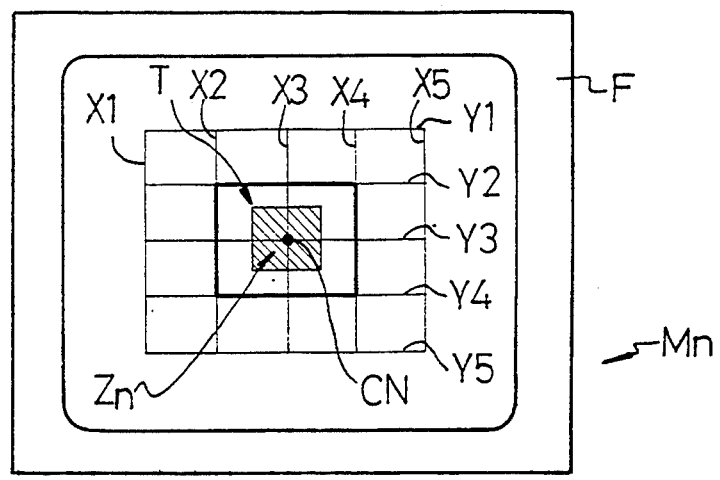
FIGS. 9A to 9C show three examples of central figures for use in test.
Figure 9B:
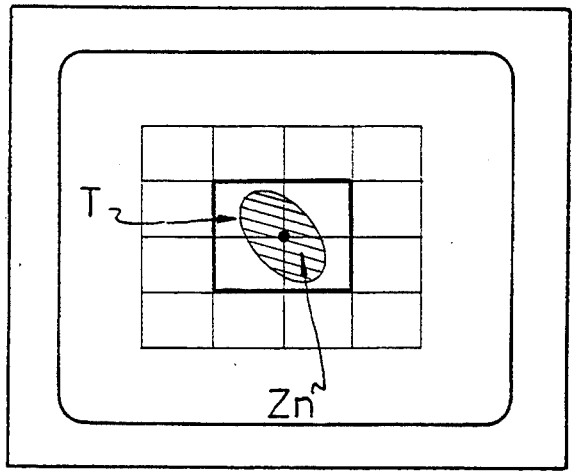
Figure 9C:
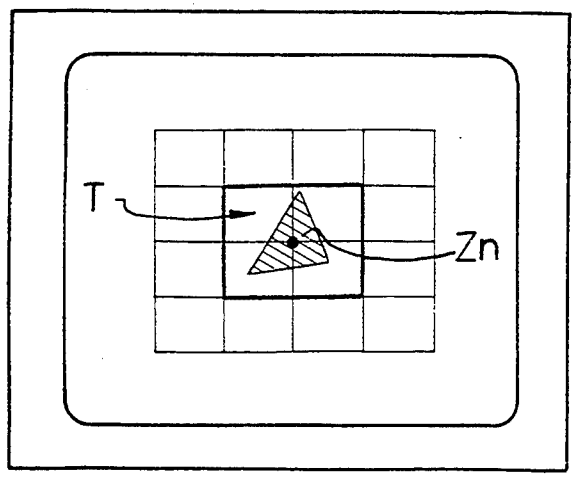

A practical example of auxiliary figure is a square, as shown in FIG. 9A, but it can also be an ellipse (see FIG. 9B) or a triangle (see FIG. 9C) or any other geometrical figure, of which the mass center (Zn) coincides with the center (CN) of the standard figure.

With the auxiliary figure, it is possible to simply and rapidly finish the adjustment in a single time. As for how to use the auxiliary figure to locate the center of the screen, it is a term of design, and the details are not necessary.

I claim:

1. An improvement in a method for testing a row of cathode ray tubes or cathode ray tube monitors, both hereinafter generally referred to as CRT, transported in a horizontal direction, said method comprising producing a standard test pattern on a CRT being tested, reading the screen of said CRT using at least one electronic camera, inputting the read data into a computer to obtain the actual values of the various geometrical parameters of the standard test pattern relative to said screen, the nominal values of various geometrical parameters of the standard test pattern relative to said screen being stored in said computer, and comparing said actual values of the geometrical parameters with said nominal values to obtain the deviations of said actual values from said nominal values, so as to adjust said CRT, the improvement comprising producing a locating pattern comprising at least three locating points on said tested CRT, reading the locating pattern using an electronic camera assembly which comprises at least two electronic cameras, of which the relative position between each individual camera is known, wherein at least two of the electronic cameras of said assembly respectively read the whole said locating pattern to obtain the position of said electronic camera assembly relative to said CRT, and using at least one of said electronic cameras of said assembly to read said standard test pattern.

2. The improvement of claim 1, further comprising illuminating the bezel of said CRT in such a manner that the reflected light from said screen does not reach any of said electronic cameras and using at least one of said electronic cameras of said assembly to read the illuminated CRT before the production of said locating pattern.

3. The improvement of claim 1 or claim 2, further comprising rigidly fixing the electronic cameras of said electronic camera assembly relative to each other and allowing said electronic cameras to read a standard plate with accurately measured dimensions to obtain the relative positions between the cameras, and inputting the data of the relative positions into said computer.

4. An improvement in an automatic testing system for testing a row of cathode ray tubes or cathode ray tube monitors one by one, both hereinafter generally referred to as CRT's, said CRT's being conveyed in a horizontal direction, said system comprising electronic camera means to read the bezel of a CRT of said row of CRT's which is being tested and a standard test pattern produced on said CRT being tested, said system being connectable to a computer in which the nominal values of the geometrical parameters of said standard test pattern relative to the screen of said CRT is stored and which receives the actual values of the read data from said electronic camera means, the improvement comprising in that said electronic camera means is an electronic camera assembly comprising at least two electronic cameras which are fixed relative to each other and of which the relative position between individual cameras is known, said system further comprising a software which can be installed in said computer and is so programmed that prior to the production of said standard test pattern a locating pattern comprising at least three points is produced on said screen and at least two electronic cameras of said electronic camera assembly are allowed to read said locating pattern to obtain the position of said CRT relative to said electronic camera assembly.

5. The improvement of claim 4, further comprising a standard plate of which the dimensions are accurately measured, and a further software which can be installed in said computer and is so programmed as to allow said electronic camera assembly to read said standard plate to obtain the relative position between the individual cameras of said electronic camera assembly.

6. The improvement of claim 4, wherein said electronic camera assembly comprises three electronic cameras fixed on a carrier board.

7. The improvement of claim 4, further comprising illuminating means to illuminate the bezel of said CRT being tested wherein the illuminating means are so arranged that no light reflected from the screen of said CRT may reach said electronic cameras.

8. The improvement of claim 7, wherein said illuminating means comprises three lights respectively illuminating the lower, the upper left and the upper right parts of said bezel from low incident angles.

9. The improvement of claim 4, further comprising shading means to insulate the CRT being tested from foreign lights.

10. The improvement of claim 4, wherein said standard test pattern is an m x n crosshatch comprising m horizontal lines and n vertical lines, m and n being odd numbers, thus giving a geometrical center (CN) of said standard test pattern, said standard pattern further comprising an auxiliary pattern in the form of a bright area which is included in the interior of a rectangle defined by the two horizontal lines and the two vertical lines immediately adjacent to said center (CN) of said standard test pattern, and of which the geometrical mass center (Zn) coincides with said center (CN).

* * * * *